United States Patent [19]
Posedel et al.

[11] Patent Number: 5,517,125
[45] Date of Patent: May 14, 1996

[54] REUSUABLE DIE CARRIER FOR BURN-IN AND BURN-IN PROCESS

[75] Inventors: Rhea Posedel, Belmount; Larry Lape, Mt. View; James Wrenn, Palo Alto, all of Calif.

[73] Assignee: AEHR Test Systems, Inc., Mountain View, Calif.

[21] Appl. No.: 89,752

[22] Filed: Jul. 9, 1993

[51] Int. Cl.⁶ .................................................. G01R 31/02
[52] U.S. Cl. ....................... 324/755; 324/761; 324/760; 324/765; 439/73; 439/71; 439/66; 439/67
[58] Field of Search .................................. 439/71, 66, 68, 439/67, 73, 264; 324/158 F, 760, 765, 755, 761

[56] References Cited

U.S. PATENT DOCUMENTS

| | | | |
|---|---|---|---|
| H13 | 6/1986 | Vratny | 439/71 |
| 4,859,189 | 8/1989 | Petersen | 439/71 |
| 4,969,828 | 11/1990 | Bright | 439/73 |
| 5,086,269 | 3/1991 | Nobi | 324/158 F |
| 5,123,850 | 6/1992 | Elder | 324/158 F |
| 5,127,837 | 6/1992 | Shah | 439/73 |
| 5,166,607 | 11/1992 | Long | 324/760 |
| 5,176,524 | 1/1993 | Mizuno | 439/73 |
| 5,176,525 | 1/1993 | Nierescher | 324/158 F |
| 5,245,277 | 9/1993 | Nguyen | 324/158 F |
| 5,397,245 | 3/1995 | Roebuck et al. | |

Primary Examiner—Kenneth A. Wieder
Assistant Examiner—Kourosh Cyrus Khosravi
Attorney, Agent, or Firm—Cooley Godward Castro Huddleson & Tatum

[57] ABSTRACT

A reusable carrier (10) for temporarily holding an integrated circuit (12) during burn-in and electrical test includes a base (14) and a lid (16) attached to the base (14) by hinges (18). A flexible substrate (19) is attached to the base (14) with a suitable adhesive. Alignment posts (20) have tapered surfaces (22) that engage corners (24) of the integrated circuit (12) to position the integrated circuit (12) precisely on upper surface (26) of the substrate (19). A spring-loaded latch (28) engages projection (30) in aperture (32) of the base (14) to hold the lid (16) closed over the integrated circuit (12). Electrically conductive traces (34) on the surface (26) have contact bumps which engage contact pads on the underside of the circuit (12) to connect the integrated circuit (12) to peripheral contact pads (38) around edges (40) of the substrate (19). A spring (42) engages upper surface (43) of the circuit (12) when the lid (16) is in its closed position over the integrated circuit (12), to provide a biasing force to urge the contact pads against the conductive traces (34) with sufficient force to insure a reliable electrical connection. For burn-in, the temporary package (10) containing the integrated circuit die (12) is now loaded into a socket (48) on a burn-in board (50), which is then loaded into a burn-in system, where otherwise standard burn-in is performed.

25 Claims, 8 Drawing Sheets

REUSABLE DIE CARRIER FOR BURN-IN AND BURN-IN PROCESS

BACKGROUND OF THE INVENTION

1. Field of the Invention

The present invention relates generally to a fixture and process for use during evaluation of integrated circuits and other semiconductor devices. More particularly, it relates to a reusable carrier for temporarily holding a semiconductor device as an unpackaged die while the semiconductor device is tested and/or burned in and to a burn-in and/or electrical test process using a reusable carrier.

2. Description of the Prior Art

When fabrication of integrated circuits and other semiconductor devices, such as discrete power transistors, has been completed, the semiconductor devices are subjected to burn-in and electrical test in order to identify and eliminate defective semiconductor devices before shipment to a customer. The term "burn-in" relates to a procedure in which the semiconductor devices are exercised at a controlled temperature, typically an elevated temperature in an oven, and certain operating electrical bias and/or signals are supplied to the semiconductor devices while they are at the elevated temperature. The use of the elevated temperature accelerates stress to which the devices are subjected during burn-in, so that marginal devices that would otherwise fail shortly after being placed in service fail during burn-in and are eliminated before shipping. In electrical test, a more complete set of operating electrical bias and signals are supplied to the device to provide a thorough evaluation of its functions.

As presently practiced, both burn-in and complete electrical test are not carried out until the semiconductor devices have been assembled in packages as they will be inserted in circuit boards. For burn-in, the packaged devices are temporarily inserted in sockets of special burn-in boards which include circuit traces for contacting a sufficient number of contact pins or pads on the packages to provide the operating electrical bias and/or signals used during burn-in. In some burn-in applications, contact needs to be made only to a limited number of pins or pads of a packaged integrated circuit. For electrical test to verify performance, the integrated circuit is removed from the burn-in board and placed in a test fixture that will allow electrical contact to all of the pins or pads of the packaged integrated circuit.

When a packaged integrated circuit is found to be defective during burn-in or electrical test, it must be scrapped. In addition to the defective die, the integrated circuit package itself must be discarded. For many years, it has therefore been desired to carry out the testing and burn-in of integrated circuits at the die level, before being packaged. Also, the advent of multi-chip modules (MCMs) has led to a new requirement for actually shipping devices in die form for assembly of several die into an MCM. The die must be tested and burned in before assembly into the MCM, since MCMs are difficult and expensive to repair. While many proposals to do this have been made, they have not achieved general use. A significant factor preventing burn-in and/or electrical test at the die level has been the lack of a fixture for carrying and protecting the die during burn-in and/or electrical test that will meet the stringent requirements for such a carrier.

SUMMARY OF THE INVENTION

Accordingly, it is an object of this invention to provide a novel reusable carder for temporarily holding a semiconductor die.

It is another object of the invention to provide such a reusable carder for temporarily holding a semiconductor die for burn-in that is also suitable for use in electrical test of the semiconductor die.

It is still another object of the invention to provide a process using a reusable carrier for burn-in evaluation of a semiconductor die.

It is yet another object of the invention to provide such a process in which the reusable carrier is further used for electrical test of the semiconductor die.

It is a further object of the invention to provide such a reusable carrier for temporarily holding a semiconductor die that can be used with conventional burn-in systems and burn-in boards in the process.

It is still another object of the invention to provide such a reusable carrier for temporarily holding a semiconductor die that can readily be provided in different sizes for different size die and different numbers of pins.

It is yet another object of the invention to provide such a reusable carrier for temporarily holding a semiconductor die in which the semiconductor die can be environmentally protected.

The attainment of these and related objects may be achieved through use of the novel reusable die carrier and burn-in process herein disclosed. A reusable die carder in accordance with this invention has a base having a plurality of carrier contacts for electrical connection of the semiconductor die external of the reusable carder. A plurality of electrically conductive traces on the base have first ends connected to the peripheral contacts and have second ends positioned to engage die contacts on the semiconductor die. A means on the base positions the semiconductor die with the die contacts engaging the second ends of the plurality of electrically conductive traces. A lid is configured for removable positioning over the base to cover the semiconductor die. A means fastens the lid in position over the base.

A process in accordance with the invention for burn-in of an unpackaged semiconductor die includes providing a reusable carder for the semiconductor die having a plurality of contacts on the career. The semiconductor die is inserted in the reusable carrier. The semiconductor die is heated to an elevated temperature. Burn-in input electrical bias and, optionally signals, are supplied from a source external of the reusable carrier to at least some of the contacts and through the reusable carrier to the semiconductor die. Burn-in output electrical signals in response to the burn-in input electrical signals, if supplied, are received from the semiconductor die and through the reusable carrier from at least some of the plurality of contacts. The burn-in output electrical signals are evaluated to categorize the semiconductor die as good or defective.

The attainment of the foregoing and related objects, advantages and features of the invention should be more readily apparent to those skilled in the art, after review of the following more detailed description of the invention, taken together with the drawings, in which:

DETAILED DESCRIPTION OF THE INVENTION

Turning now to the drawings, more particularly to FIGS. 1–4, there is shown a reusable carrier 10 for temporarily holding an integrated circuit 12 during burn-in and/or electrical test. The reusable carrier 10 includes a base 14 and a lid 16 attached to the base 14 by hinges 18. A flexible substrate 19, formed from a suitable polymeric material, e.g. polyimide, is attached to the base 14 with a suitable adhesive. Four alignment posts 20 have tapered surfaces 22 that engage comers 24 of the integrated circuit 12 to position the integrated circuit 12 precisely on upper surface 26 of the substrate 19. A spring-loaded latch 28 engages projection 30 in aperture 32 of the base 14 to hold the lid 16 closed over the integrated circuit 12. Electrically conductive traces 34 on the surface 26 have contact bumps (not shown) which engage contact pads (not shown) on the circuit 12 to connect the integrated circuit 12 to peripheral contact pads 38 around edges 40 of the substrate 19. The bumps could alternatively be provided on the circuit 12, rather than on the traces 34. A spring 42 engages upper surface 43 of the circuit 12 (which comprises the back side of the integrated circuit 12) when the lid 16 is in its closed position over the integrated circuit 12, to provide a biasing force to urge the contact pads against the conductive traces 34 with sufficient force to insure a reliable electrical connection. A thin layer of rubber or other suitable compliant material may be provided between the flexible substrate 19 and the base 14 in order to even out the force between the contact pads and the bumps on the conductive traces 34. A vacuum port 46 is provided through the base 14, substrate 19 and compliant material to permit application of a vacuum to hold the integrated circuit 12 in place on the substrate 19. In practice, the substrate 19 is desirably a commercially available substrate, available from several manufacturers using different technologies. For example, the substrate could be an ASMAT substrate, obtainable from Nitto Denko.

The reusable carrier 10 is masonably environmentally protected, so that the unpackaged integrated circuit 12 no longer needs to be handled in a clean room environment. The reusable career 10 can now be used in standard burn-in or test systems.

For burn-in, the temporary package 10 containing the integrated circuit die 12 is now loaded into a socket 48 on a burn-in board 50, which is then loaded into a burn-in system, where otherwise standard burn-in is performed. The pads 38 of the substrate 19, now pan of the temporary package 10, contact leads 52 of the burn-in socket 48. As is conventional, burn-in may be carried out with the application of no more than an operating potential to the integrated circuit, with the application of both operating potential and operating signals supplied to exercise the integrated circuit 12, or with the application of both operating potential and operating signals and the sensing of output signals from the integrated circuit 12 during burn-in.

Figure 1:
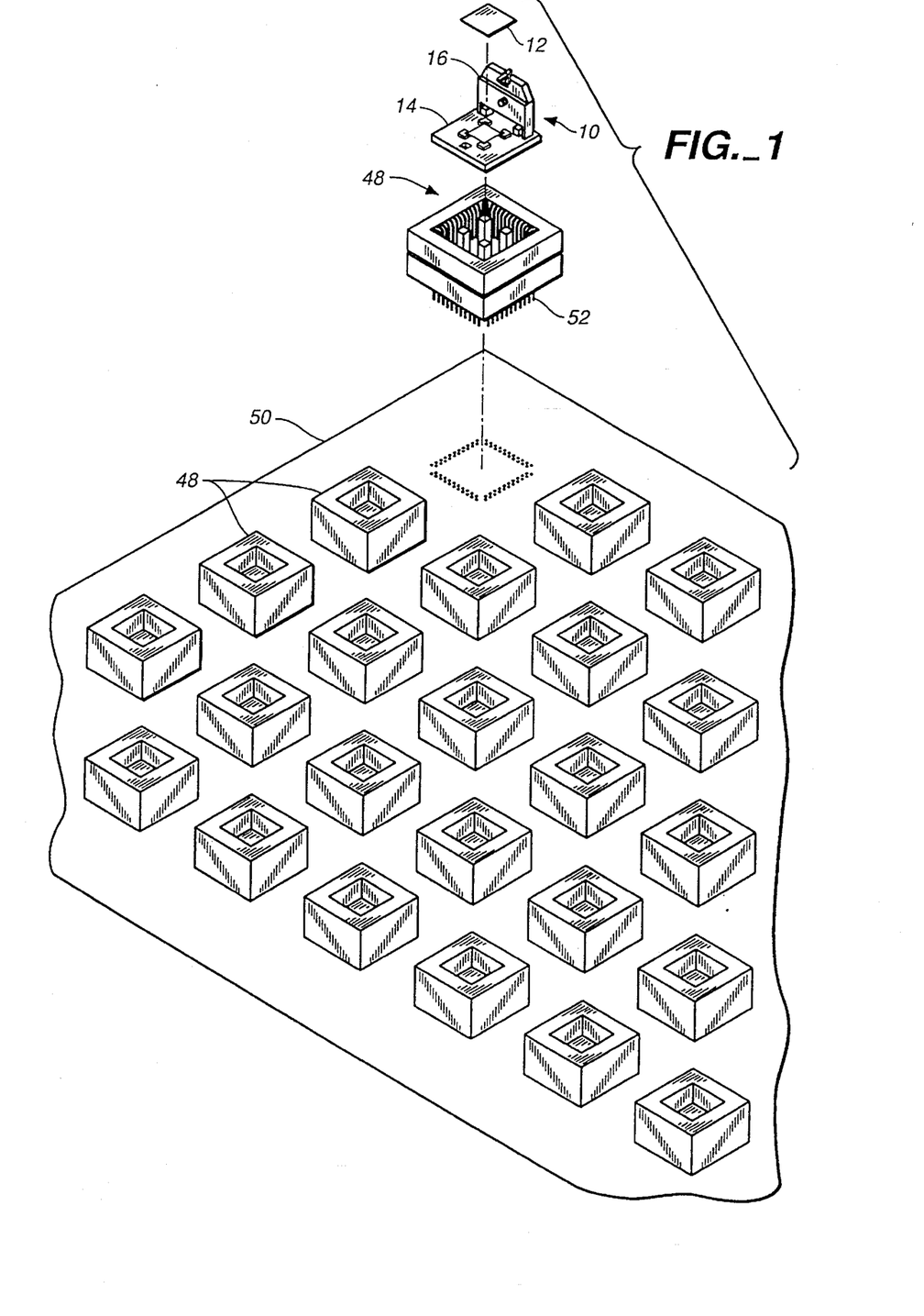
FIG. 1 is an exploded perspective view of a reusable carrier in accordance with the invention for temporarily holding a semiconductor die.
Figure 2:
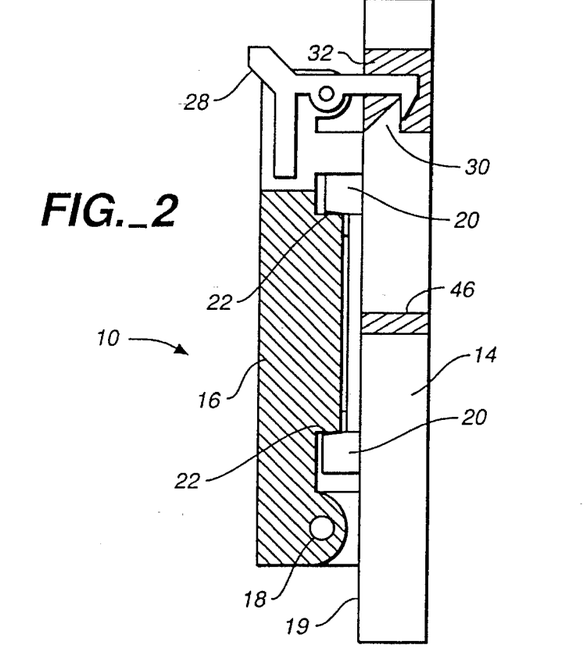
FIG. 2 is a cross section view of the reusable carrier for temporarily holding a semiconductor die of FIG. 1 in assembled form, ready for use.
Figure 3:
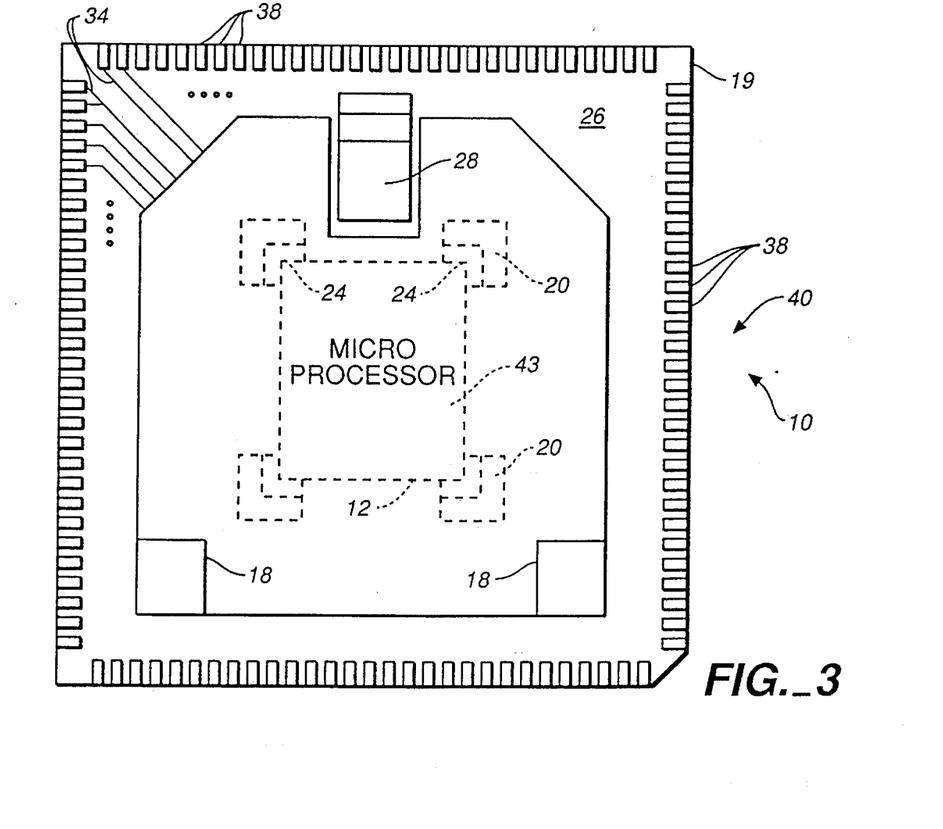
FIG. 3 is a plan view of the reusable carrier for temporarily holding a semiconductor die of FIGS. 1–2.
Figure 4:
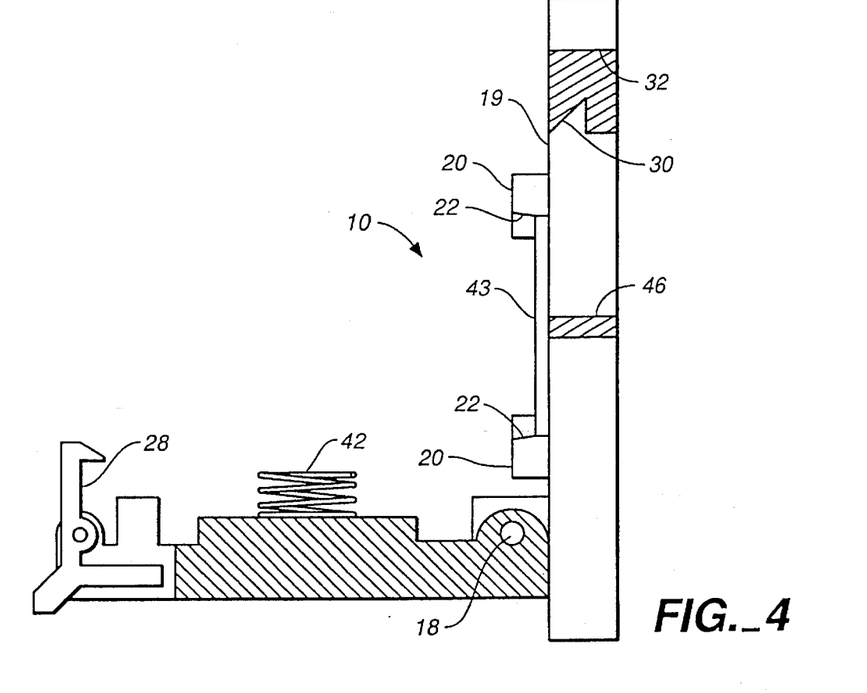
FIG. 4 is a cross section view of the reusable carrier for temporarily holding a semiconductor die similar to FIG. 2, but with the carrier in an open position.
Figure 5:
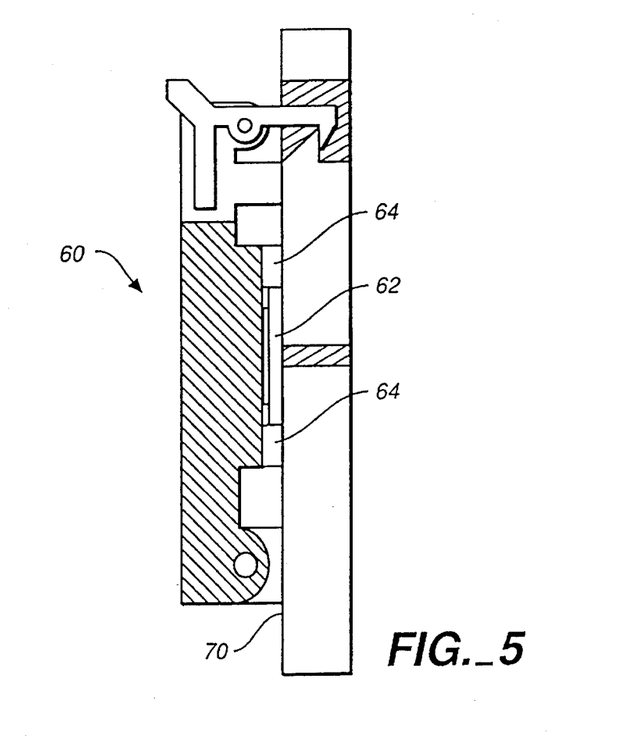
FIG. 5 is a cross section view similar to FIG. 2, but of a second embodiment of a reusable carrier in accordance with the invention for temporarily holding a semiconductor die.
Figure 6:
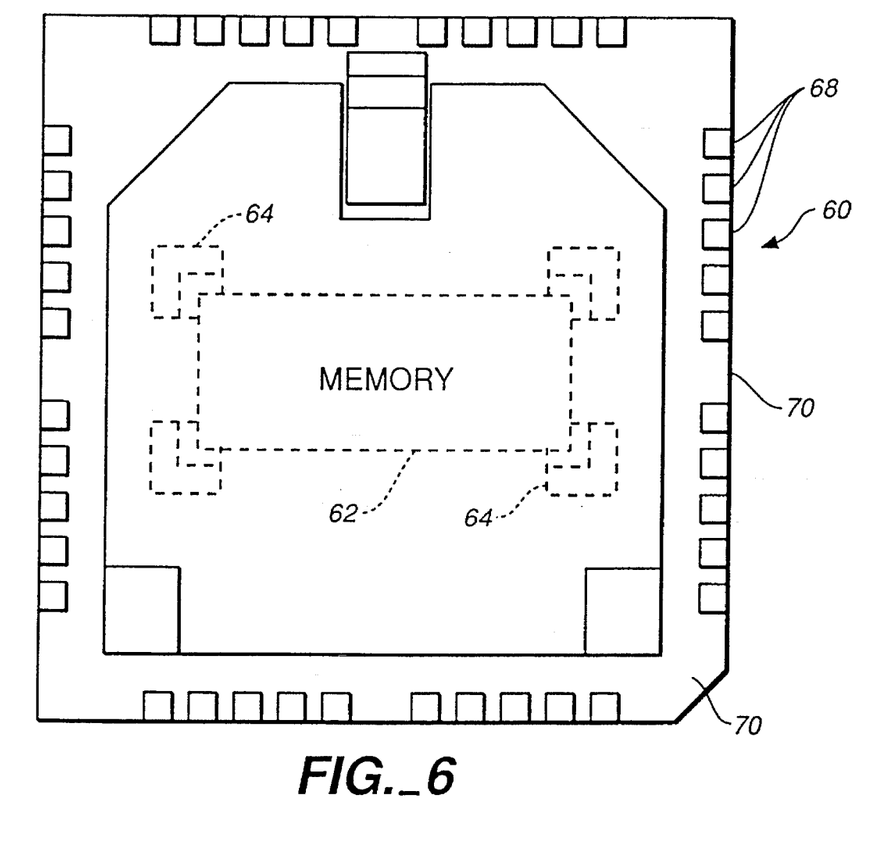
FIG. 6 is a plan view similar to FIG. 3, but of the FIG. 5 embodiment of the reusable carrier for temporarily holding a semiconductor die.
Figure 6A:
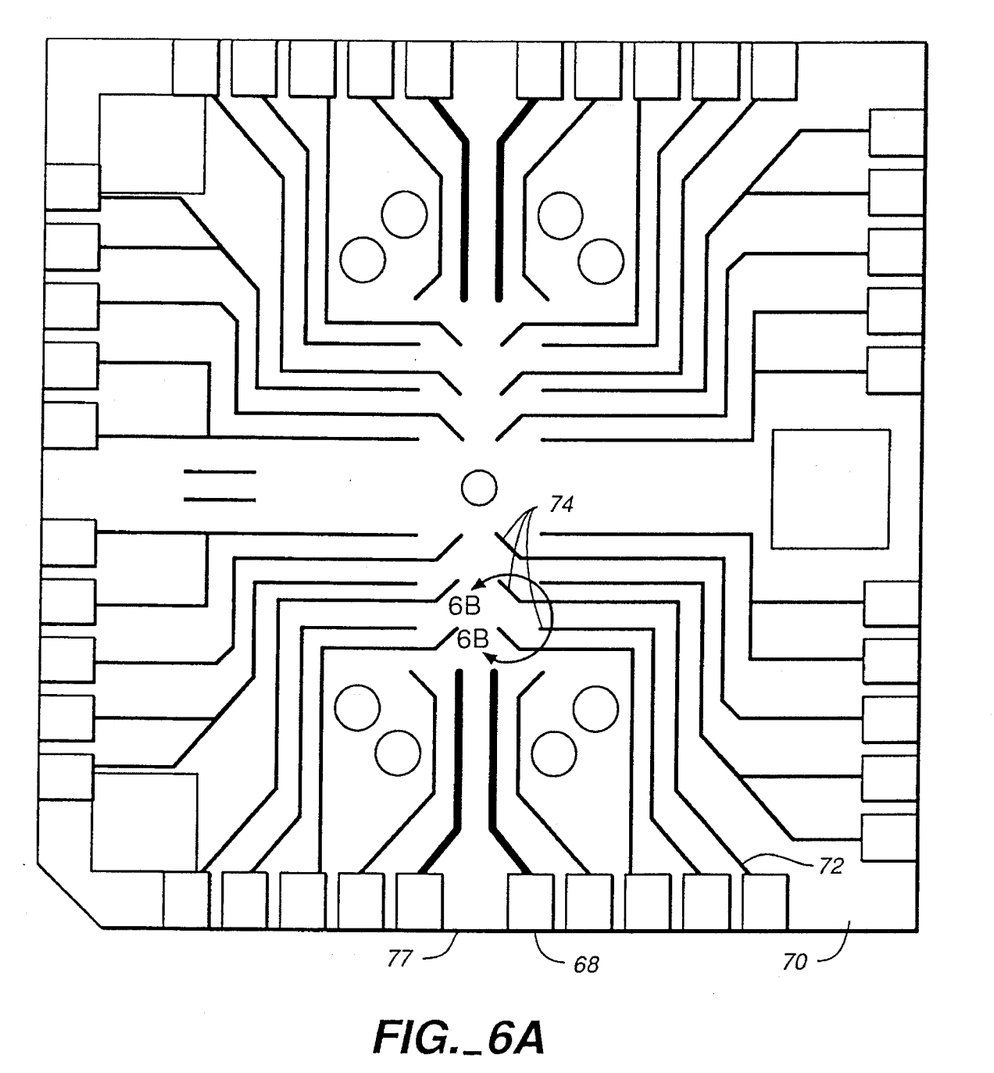
FIG. 6A is a plan view of a portion of the reusable carrier of FIGS. 5–6.
Figure 6B:
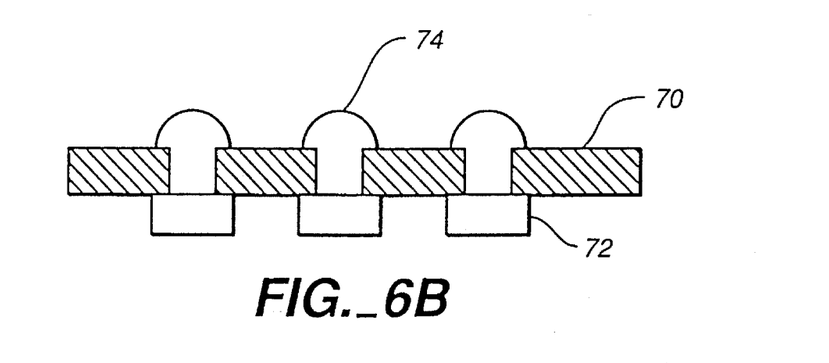
FIG. 6B is a cross section view of area 6B in FIG. 6A.

FIGS. 5–6B show another reusable carrier 60 for use with a memory integrated circuit 62. Tapered alignment posts 64 are positioned to receive the different shaped integrated circuit 62 in a precise position so that its contact pads will engage contact bumps on substrate 70. As in the FIGS. 1–4 embodiment, electrically conductive copper traces 72 on flexible polyimide substrate 70 have contact bumps 74 which engage contact pads on the circuit 62 to connect the integrated circuit 62 to peripheral contact pads 68 around edges 77 of the substrate 70. Other than as shown and described, the construction and operation of the FIGS. 5–6B embodiment of the invention is the same as that of the FIGS. 1–4 embodiment.

Figure 7:
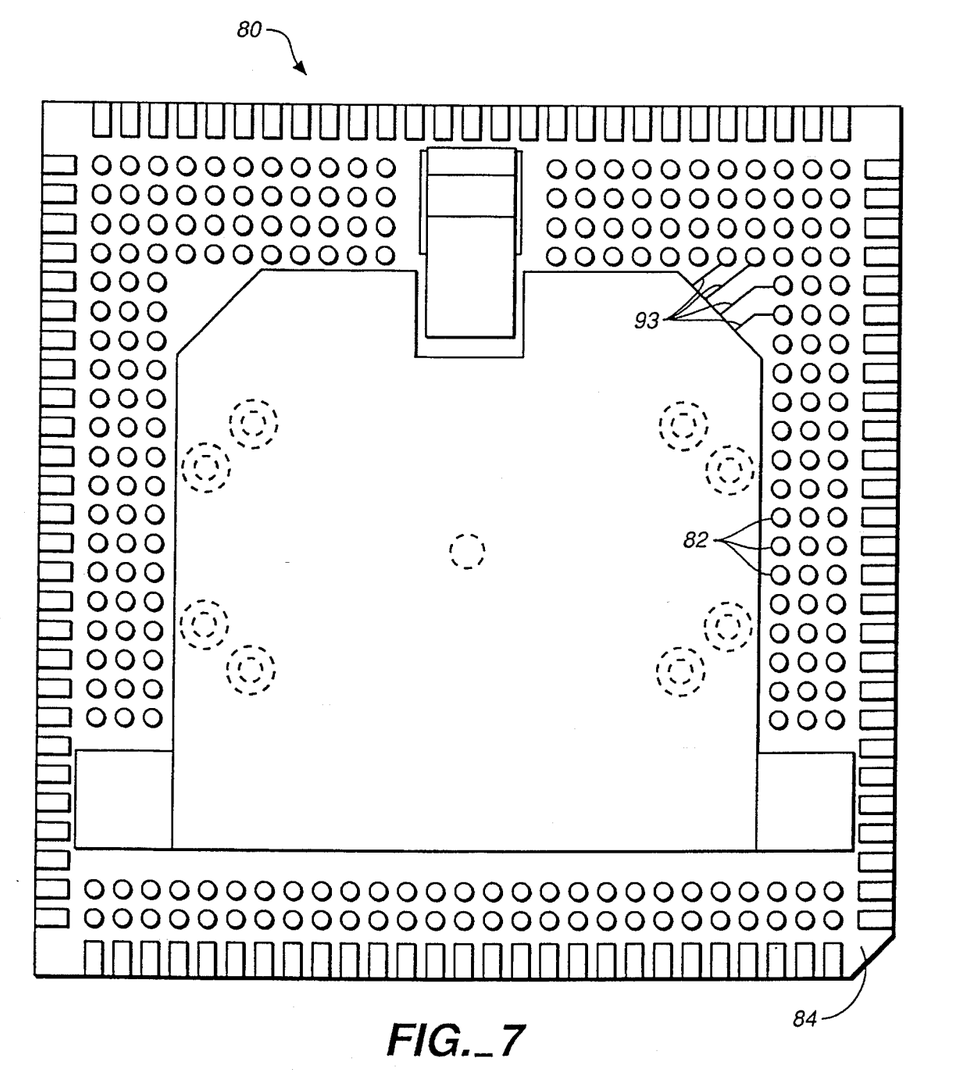
FIG. 7 is a plan view of a third embodiment of a reusable carrier in accordance with the invention for temporarily holding a semiconductor die.
Figure 8:
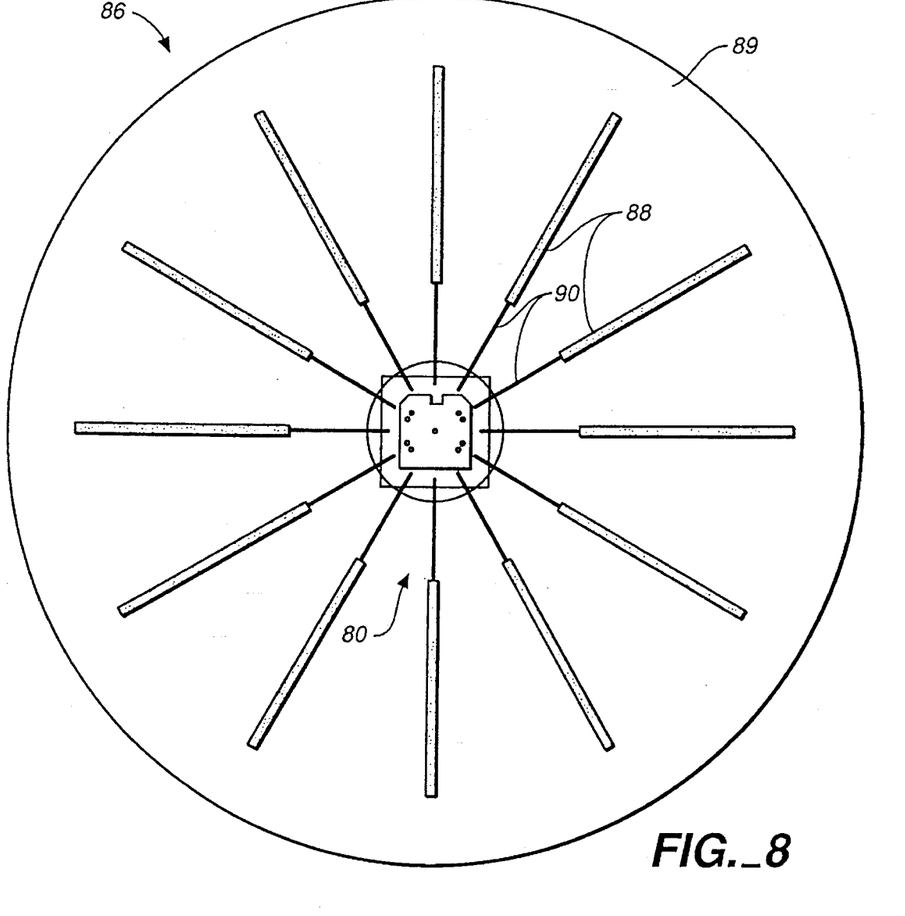
FIG. 8 is a plan view of the reusable career of FIG. 7 in use with a test fixture.
Figure 9:
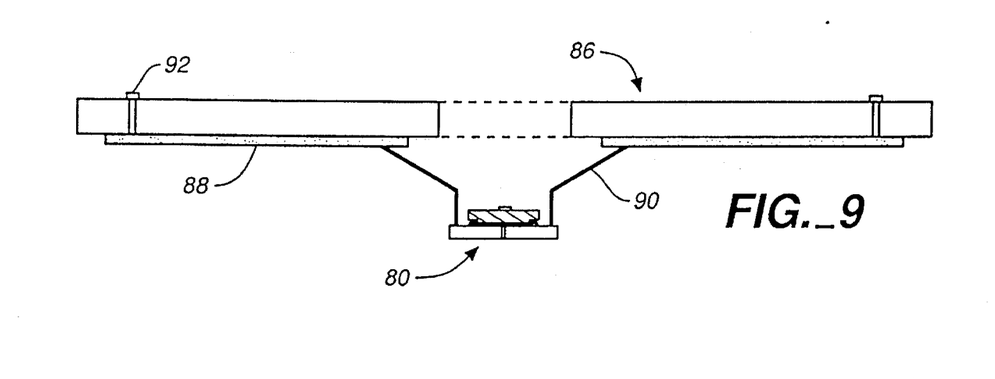
FIG. 9 is a cross section view, taken along the line 9—9 in FIG. 8.

FIG. 7 shows a reusable carrier 80 having additional contact pads 82 on substrate 84 for testing. For test, which often requires more contacts than burn-in, the reusable carrier 80 is loaded into a probe card 86 (FIGS. 8–9) in a tester (not shown). The probe card 86 has a plurality of conductive traces 88 on an epoxy or polyimide board 89, each connected to a probe tip 90 for contacting the additional pads 82 for testing and to a tester connection 92. For clarity, only twelve traces 88 are shown. In practice, an actual probe card might contain hundreds of conductive traces 88 and probe tips 90. Additional pads 82 are connected to an integrated circuit under test by conductive traces 93 on substrate 84 and are used for the additional contacts needed for test. This construction of the substrate 84 allows the socket 48 (FIG. 1) used for burn-in to have significantly fewer pins than would otherwise be needed for test, saving cost in burn-in, since typically thousands of times more burn-in sockets than probe cards are required. The electrical test is carded out either prior to or after burn-in.

Figure 10:
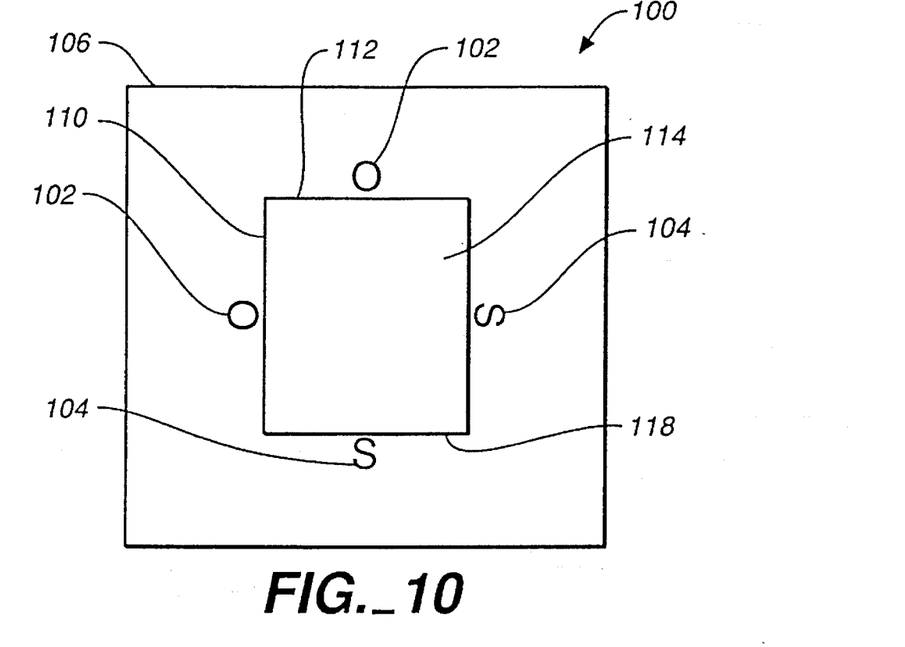
FIG. 10 is a plan view of a portion of another embodiment of a reusable carrier in accordance with the invention.
Figure 11:
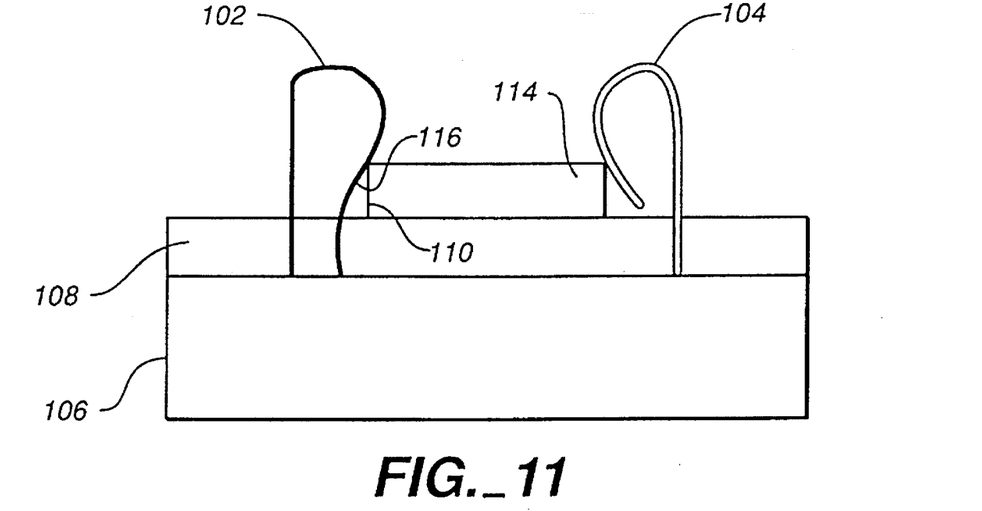
FIG. 11 is a side view of the die carrier portion shown in FIG. 10.

FIGS. 10–11 show pan of a die career 100, in which a combination of fixed posts 102 and springs 104 provide an alignment mechanism for the die carrier. The posts 102 and springs 104 are attached to base 106 and extend through flexible substrate 108. The fixed posts 102 fix the location of two adjacent sides 110 and 112 of die 114, assuring that the die is properly positioned on the substrate 108. A taper 116 at the base of the posts 102 holds down the two adjacent sides 110 and 112 when the die 114 is pressed against the posts 102. The pressure to hold the die 114 against the posts 102 is supplied by the two springs 104, which are shaped also to supply a slight downward pressure on the two edges 118 of the die in contact with the springs 104. This downward pressure on the die 114 holds it in place as a die positioning mechanism (not shown) releases it and pulls away from the die 114, overcoming any electrostatic or molecular attraction between the die and the positioning mechanism. This pressure serves the same function of holding the die 114 in place when the carder lid (not shown)

is opened after the burn-in or test. Other than as shown and described, the construction and operation of the FIGS. 10–11 embodiment of the invention is the same as that of the FIGS. 1–6B embodiments.

It should now be readily apparent that a novel reusable die carrier for burn-in and burn-in process capable of achieving the stated objects of the invention has been provided. The reusable carder temporarily holds a semiconductor die. In one form, the reusable carder temporarily holds a semiconductor die for burn-in and is also suitable for use in electrical test of the semiconductor die. This form of the invention provides a substantial savings tier burn-in sockets where only a limited number of pins are required for burn-in sockets, since extra contact pads can be provided in the reusable carder for contacting an integrated circuit in the carder for test. The process uses the reusable carder for burn-in evaluation of a semiconductor die, and optionally for electrical test of the semiconductor die. The reusable carder can be used with conventional burn-in systems and burn-in boards in the process. The reusable carrier can readily be provided in different sizes for different size die and different numbers of pins. One socket design on a burn-in board might be used with a variety of integrated circuit die in the die carrier by substrate redesign. The proper direction of signals to the different integrated circuit die can be accomplished by the use of different substrates in the die carrier. This capability means that it is possible to move toward a universal burn-in board. In the reusable carrier the semiconductor die is environmentally protected.

It should further be apparent to those skilled in the art that various changes in form and details of the invention as shown and described may be made. It is intended that such changes be included within the spirit and scope of the claims appended hereto.

What is claimed is:

1. A reusable carrier for a semiconductor die, which comprises:

a base having a plurality of carrier contacts for electrical connection of the semiconductor die external of said reusable carrier;

a plurality of electrically conductive traces on said base, having first ends connected to said carrier contacts and having second ends positioned to engage die contacts on the semiconductor die, said plurality of electrically conductive traces being configured to engage the die contacts of an integrated circuit as the semiconductor die;

an additional plurality of electrically conductive traces on said base, said additional plurality of electrically conductive traces having first ends connected to a plurality of test contacts for electrical test of the semiconductor die, and second ends positioned to engage additional die contacts on the semiconductor die, where the connection of the additional traces to the test contacts are in a manner different from the connection of the first electrically conductive traces to the carrier contacts;

at least one alignment member having alignment surfaces for engaging a portion of the semiconductor die to automatically and precisely position the die on said base with the die contacts engaging the second ends of said plurality of electrically conductive traces;

a vacuum port extending through said base to engage the semiconductor die while the semiconductor die is being engaged by said alignment member;

a lid configured for removable positioning over said base to cover the semiconductor die; and means for fastening said lid in position over said base.

2. The reusable carrier for a semiconductor die of claim 1 in which said plurality of carrier contacts are connected to a plurality of pins and said test contacts are positioned on said base for engagement by a plurality of electrical test probes.

3. A reusable carrier for a semiconductor die, which comprises:

a base having a plurality of carrier contacts for electrical connection of the semiconductor die external of said reusable carrier:

a plurality of electrically conductive traces on said base, having first ends connected to said carrier contacts for burn-in of the semiconductor die and having second ends positioned to engage die contacts on the semiconductor die;

a plurality of test electrical contacts on said base for making electrical connection to the semiconductor die for electrical test of the semiconductor die, where the connections between the test electrical contacts and the semiconductor die are in a manner different from the connection between the carrier contacts to the semiconductor die;

a vacuum port extending through said base to engage the semiconductor die when the semiconductor die is in said means for positioning the semiconductor die; and a lid configured for removable positioning over said base to cover the semiconductor die.

4. The reusable carrier for a semiconductor die of claim 3 in which said plurality of carrier contacts are connected to a plurality of pins and said test contacts are positioned on said base for engagement by a plurality of electrical test probes.

5. The reusable carrier for a semiconductor die of claim 3 in which said base comprises a rigid member having an upper surface and a flexible substrate for the semiconductor die over the upper surface, with said plurality of burn-in carrier contacts and said plurality of test electrical contacts being on said flexible substrate.

6. A process for burn-in of an unpackaged semiconductor die, which comprises:

providing a reusable carrier for the semiconductor die having a first and a second set of a plurality of contacts on the carrier;

inserting the semiconductor die in the reusable carrier;

connecting at least some of the contacts in the first set with the semiconductor die in a first manner;

establishing the semiconductor die at a desired temperature;

supplying a burn-in electrical input from a source external of the reusable carder to the contacts connected in said first manner, and through the reusable carrier to the semiconductor die;

maintaining the semiconductor die at the desired temperature during burn-in;

placing the semiconductor die in a tester after burn-in;

connecting at least some of the contacts in the second set with the semiconductor die in a second manner different from the first manner; and supplying electrical test input electrical signals from a source external of the reusable carrier to the contacts connected in said second manner, and through the reusable carrier to the semiconductor die.

7. The process of claim 6 in which the burn-in electrical input includes operating input signals for the semiconductor die.

8. The process of claim 7 additionally comprising receiving burn-in output electrical signals in response to the burn-in input electrical signals from the semiconductor die and through the reusable carrier from at least some of the plurality of contacts connected in said first manner; and evaluating the burn-in output electrical signals to categorize the semiconductor die as good or defective.

9. The process of claim 8 additionally comprising the steps of removing the semiconductor die categorized as good from the reusable carrier and packaging the semiconductor die in a semiconductor die package.

10. The process of claim 6 additionally comprising the steps of receiving electrical test output electrical signals in response to the electrical test input electrical signals from the semiconductor die and through the reusable carrier from at least some of the plurality of contacts connected in said second manner; and evaluating the electrical test output electrical signals to categorize the semiconductor die as good or defective.

11. The process of claim 10 additionally comprising the steps of removing the semiconductor die categorized as good from the reusable carrier and packaging the semiconductor die in a semiconductor die package.

12. The process of claim 10 in which the steps of supplying electrical test input signals, receiving electrical test output signals and evaluating the electrical test output electrical signals are carried out after inserting the semiconductor die in the reusable carrier and prior to burn-in.

13. The process of claim 12 in which the steps of supplying electrical test input signals, receiving electrical test output signals and evaluating the electrical test output electrical signals are repeated after burn-in.

14. The process of claim 10 in which the steps of supplying electrical test input signals, receiving electrical test output signals and evaluating the electrical test output electrical signals are repeated after burn-in.

15. The process of claim 6, 7, 8, 9, 10, 11, 12, 13 or 14 in which the semiconductor die is an integrated circuit.

16. The reusable carrier for a semiconductor die of claim 3 further comprising means for positioning the semiconductor die with the die contacts engaging said plurality of electrical contacts.

17. The reusable carder for a semiconductor die of claim 16 in which said reusable carrier additionally comprises a layer of resilient compliant material between said flexible substrate and said base.

18. The reusable carrier for a semiconductor die of claim 17 in which said means for positioning the semiconductor die comprises at least one alignment member having an alignment surface for engaging a portion of the semiconductor die.

19. The reusable carrier for a semiconductor die of claim 18 further comprising means for fastening said lid in position over said base.

20. The reusable carrier for a semiconductor die of claim 19 additionally comprising a means on said lid for biasing the semiconductor die against the electrical contacts.

21. The reusable carrier for a semiconductor die of claim 20 in which said lid has an inner surface and said means for biasing the semiconductor die against the electrical contacts comprises a spring attached to the inner surface of said lid.

22. The reusable carrier for a semiconductor die of claim 21 in which said lid is attached to said base by at least one hinge.

23. The reusable carrier for a semiconductor die of claim 22 in which said means for fastening said lid in position over said base comprises a latch configured for holding engagement of said base.

24. The reusable carrier for a semiconductor die of claim 18 in which said alignment members comprise a plurality of posts.

25. The reusable carrier of a semiconductor die of claim 1 in which said alignment members comprise a plurality of posts.

* * * * *

UNITED STATES PATENT AND TRADEMARK OFFICE
CERTIFICATE OF CORRECTION

PATENT NO. : 5,517,125
DATED : May 14, 1996
INVENTOR(S) : RHEA POSEDEL, et al.

It is certified that error appears in the above-identified patent and that said Letters Patent is hereby corrected as shown below:

On the title page, item [54] and column 1, line 1,
"REUSUABLE" should read --REUSABLE--; at [75] "Belmount" should read --Belmont--, and "Mt." should read --Mountain--

Column 1, line 66, "carder" should read --carrier--.

Column 2, line 2, "carder" should read --carrier--; line 41, "carder" should read --carrier--.

Column 3, line 19, "career" should read --carrier--; line 66, "masonably" should read --reasonably--.

Column 4, line 2, "career" should read --carrier--; line 49, "career" should read --carrier--; line 67, "carder" should read --carrier--.

Column 5, lines 8, 9, 15, 16 (occurring twice), and 19, "carder" should read --carrier--.

Column 8, line 5, "carder" should read --carrier--.

Signed and Sealed this

Ninth Day of December, 1997

*Attest:*

*Attesting Officer*

BRUCE LEHMAN
*Commissioner of Patents and Trademarks*